United States Patent [19]
Marconi

[11] 3,714,513
[45] Jan. 30, 1973

[54] PRINTED CIRCUIT CARD RETAINER AND RACK ASSEMBLY

[76] Inventor: Joseph Marconi, 428 S. Jensen Road, Vestal, N.Y. 13850

[22] Filed: Sept. 1, 1971

[21] Appl. No.: 176,837

[52] U.S. Cl. ..............................317/101 DH, 211/41
[51] Int. Cl. ..............................................H02b 1/02
[58] Field of Search ...................317/101 DH; 211/41

[56] References Cited

UNITED STATES PATENTS 3,258,650 6/1966 Fiege ............................317/101 DH
3,098,177 7/1963 Bleier et al.....................317/101 DH
3,247,424 4/1966 Kossoy et al...................317/101 DH

*Primary Examiner*—David Smith, Jr.
*Attorney*—Frederick E. Bartholy

[57] ABSTRACT

A printed circuit card retainer and rack assembly is described. The retainers comprise resilient arcuate channel members of chamfered U-shaped cross section permitting vertical alignment of cards of diverse thickness. The retaining force exerted by the resiliency and deformation of the members is in the direction parallel to the face of the card.

4 Claims, 5 Drawing Figures

PATENTED JAN 30 1973

3,714,513

INVENTOR
JOSEPH MARCONI

BY Frederick E Bartholy

ATTORNEY

PRINTED CIRCUIT CARD RETAINER AND RACK ASSEMBLY

This invention relates to printed circuit card holders or racks which, in the form of a cage, accommodate a plurality of cards in spaced relationship.

In the present state of electronic technology, components of a circuit are mounted on flat plates of an insulated material which have a conductive backing. The latter is cut out or etched to present conductive paths of predetermined configuration, whereby the various components are interconnected in accordance with a schematic circuit. Such plates are generally known as printed circuit boards or cards.

The circuits presented by a number of cards are generally interconnected by suitable terminal sockets of the plug type into which the cards may easily be inserted. Thus the purpose of the rack is to provide a frame or cage for retainers which accommodate the cards and to serve as a support for the terminal sockets. The retainers for the cards are in most cases of channel-type construction for slideably supporting the cards.

It is manifestly of great advantage if the retainers allow easy insertion and removal of the cards and, at the same time, provide a firm hold.

The retainers of printed circuit boards of the prior art generally depend upon face-to-face contact, i.e., a force exerted in the direction perpendicular to the card surface. Obviously, in such type of holder a compromise must be made between the strength of grip of the card face and the ease of removal. A tight grip will not permit easy removal of the cards. As a matter of fact, since manual handling is generally necessary, such tight gripping may result in damage to the components by the fingers of the person trying to slide the card out of its holder.

Accordingly, it is a primary object of this invention to provide retaining members for printed circuit cards adapted to be mounted on a rack which, while of the sliding type, exert a firm hold and allow easy removal or insertion of such cards.

It is a distinct feature of the invention that the retaining force exerted on the cards is in the direction parallel to the face of the card, namely, between the edges thereof.

It is a particular advantage of the invention that the card retaining members, by virtue of their cross-sectional configuration, permit the insertion of cards of diverse thickness while maintaining normal alignment thereof.

Other objects, features, and advantages will be apparent from the following description of the invention, defined in particularity in the appended claims, and taken in connection with the accompanying drawing, in which:

Figure 1:
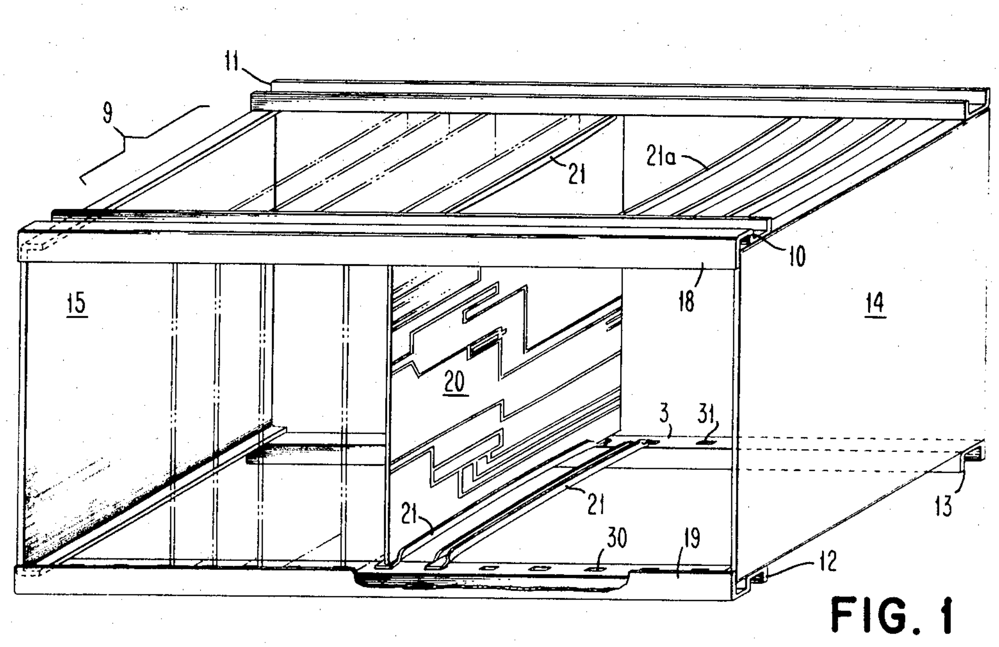
FIG. 1 is a perspective view of a printed circuit card rack constructed in accordance with the invention.

Referring to the figures, it is seen in FIG. 1 that the rack 9 presents a frame of oblong configuration, consisting of parallel support members 10, 11, 12 and 13 which are joined to end plates 14 and 15. Support members 10 and 12 have inwardly extending lips 18 and 19, respectively, the purpose of which, as will be understood later, is to act as an abutting wall for the circuit board 20. Consequently, the illustration in FIG. 1 is a back view of the rack 9. The latter accommodates a plurality of card retainers 21 in spaced relationship. For the sake of simplifying the drawing, only two retainers are shown in detail. Any number of these may be used, depending upon the size of the rack 9. The retainers 21 are placed between support members 10 and 11, and 12 and 13, respectively. The distance between the placement of retainers 21 depends upon the component elements of circuit board 20. Sufficient space must be provided so that each circuit board 20 may be easily inserted between oppositely placed retainers.

Inasmuch as all retainers are of like construction, a single reference character 21 is chosen to represent them, whether placed on the top of the rack 9 or on the bottom thereof.

Figure 2:
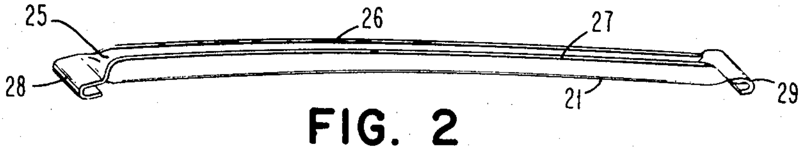
FIG. 2 is a view in perspective of a card retaining member.

Referring to FIG. 2, it is seen that the retainer 21 comprises essentially a channel member having a flat bottom portion 25 and side walls 26 and 27 so that the structure forms a U-shaped trough. The bottom portion 25 extends into lips 28 and 29 which are shown here as crimped. This is the shape when assembled, namely, the lips 28 and 29 turned back after being inserted into appropriate slots 30 and 31 provided in the support members 10 and 11 or 12 and 13, respectively. In this manner, the retainers 21 are firmly held in place, although, as will be seen, allowing elongations thereof in the axial direction.

The retainers 21 are of arcuate shape and are fabricated from resilient materials such as, for example, spring steel or beryllium copper. Both the arcuateness and resiliency of the retainers 21 are important features with respect to their function.

Figure 3:
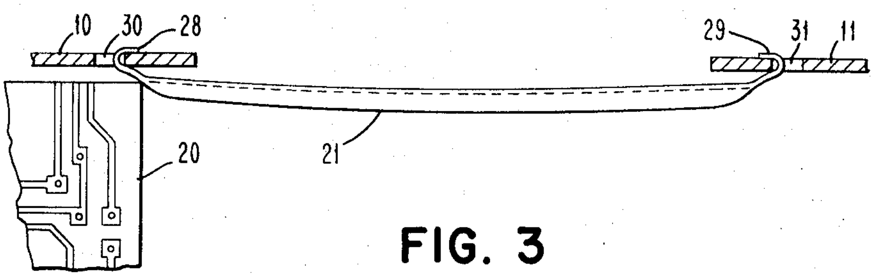
FIG. 3 is a sectional view taken along lines 3—3 of FIG. 1 and also showing a portion of the circuit board about to be inserted.

The cross-sectional view in FIG. 3 illustrates the mounting of a retainer 21 as, for example, in support members 10 and 11. It is seen that slots 30 and 31 in the support members 12 and 13 or 10 and 11, as the case may be, have a larger width than would be necessary to accommodate the thickness of the lips 28 and 29. The purpose of this feature will be explained later.

Figure 4:
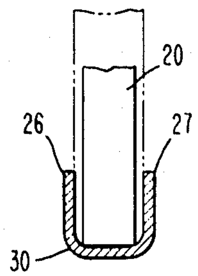
FIG. 4 is a cross-sectional view of a retaining member of the type shown in FIG. 2.
Figure 5:
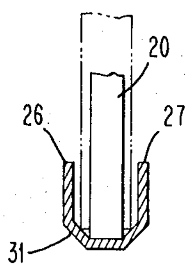
FIG. 5 is a cross-sectional view of a modified form of retaining member similar to that shown in FIG. 2.

Prior to considering FIGS. 4 and 5, reference will be had to the assembly of the rack 9 and the function of its retainers 21. As seen in FIG. 1, a circuit board 20 has been inserted between an upper retainer and a lower retainer 21. This is accomplished by sliding movement of the board 20 from the front of the rack 9 to the extent that the board 20 abuts against the lips 18 and 19 of the horizontal supporting members 10 and 12, respectively.

As the board 20 enters upper and lower retainers 21, as seen in FIG. 3, and is pushed forward, it will cause a rectilinear distortion of the arcuation of the retainers 21. The latter are thus flattened out and, in assuming a flattened shape, the lips 28 and 29 will be forced to move in a direction axial to the retainers. Room for this movement is permitted by the width of the slots 30 and 31 so that a smooth and even change of shape of the retainers may be effected. In this manner, the board 20 may be inserted with ease, without deforming the retainers 21, except for the normal flattening thereof. The board 20 is firmly held by virtue of the force exerted due to the resiliency of the material. This force is in the direction parallel to the face of the card 20. The distance between the side walls 26 and 27 of the retainer 21 is wide enough to freely accommodate the card 20 without exerting any pressure in the direction perpendicular to the face of the card 20. By virtue of this construction, the cards 20 may slide in and out of the rack 9 with ease, yet be held securely.

An additional advantage of the construction in accordance with the invention resides in the ability to accommodate cards of diverse thickness. This is accomplished by the cross-sectional configuration of the retainer 21. In one form, as shown in FIG. 4, the U-shaped configuration is radially chamfered at 33 which will seat cards of various thickness as indicated by dotted line for a card wider than that of 20.

In FIG. 5 the cross-sectional configuration is angularly chamfered as at 31. This provides proper seating for cards of varying thickness, as indicated in dotted line. Since no lateral contact between the side walls 26 and 27 of the retainer 21 is necessary for holding a card, the seating is in fact provided at the edge of the card touching the chamfered portions of the U-shaped channels. Accordingly, cards of varying thickness will be held vertically without slanting, and be seated in the center of the channel. The center line alignment is maintained, irrespective of the thickness of the inserted card.

The invention in its broader aspects is not limited to the specific embodiment herein shown and described but changes may be made within the scope of the accompanying claims without departing from the principles of the invention and without sacrificing its chief advantages.

What is claimed is:

1. A printed circuit card rack having parallel support members joined to end plates forming a solid cage, a plurality of card retainers held between adjacent support members and disposed in spaced relation between opposite support members for accommodating a card between a pair of oppositely disposed retainers, each of said retainers comprising resilient channel members of arcuate shape slideably accepting a card for retention by the force exerted due to the rectilinear distortion of the arcuation of said members effected by the presence of said card.

2. A printed circuit card rack in accordance with claim 1 wherein said channel members terminate in flat end portions adapted to be bent over slots provided in said support members, said slots being of sufficient width to permit axial movement of said members upon rectilinear distortion of their arcuation, due to the insertion of a card.

3. A printed circuit card rack in accordance with claim 1 wherein said channel members have an angularly chamfered U-shaped cross sectional configuration for the vertical center line alignment of cards of diverse thickness.

4. A printed circuit card rack in accordance with claim 1 wherein said channel members have a radially chamfered U-shaped cross sectional configuration for the vertical center line alignment of cards of diverse thickness.

* * * * *